United States Patent
Gamon et al.

(10) Patent No.: US 12,342,581 B2
(45) Date of Patent: Jun. 24, 2025

(54) METHOD AND DEVICE FOR PRODUCING AN EDGE STRUCTURE OF A SEMICONDUCTOR COMPONENT

(71) Applicant: Infineon Technologies Bipolar GmbH & Co. KG, Warstein (DE)

(72) Inventors: Tobias Gamon, Warstein (DE); Reiner Barthelmess, Soest (DE); Uwe Kellner-Werdehausen, Leutenbach (DE); Sebastian Sommer, Castrop-Rauxel (DE)

(73) Assignee: Infineon Technologies Bipolar GmbH & Co. KG, Warstein (DE)

( * ) Notice: Subject to any disclaimer, the term of this patent is extended or adjusted under 35 U.S.C. 154(b) by 289 days.

(21) Appl. No.: 17/841,871

(22) Filed: Jun. 16, 2022

(65) Prior Publication Data
US 2022/0416019 A1  Dec. 29, 2022

(30) Foreign Application Priority Data
Jun. 23, 2021  (DE) .......................... 102021116206.8

(51) Int. Cl.
*H10D 62/10* (2025.01)
*H01L 21/306* (2006.01)
*H01L 21/67* (2006.01)

(52) U.S. Cl.
CPC ..... *H10D 62/102* (2025.01); *H01L 21/30604* (2013.01); *H01L 21/6708* (2013.01)

(58) Field of Classification Search
CPC .......... H01L 29/0607; H01L 21/30604; H01L 21/6708; H01L 21/67092; H01L 29/0661;
(Continued)

(56) References Cited

U.S. PATENT DOCUMENTS 6,309,981 B1 * 10/2001 Mayer ............... H01L 21/76877
257/E21.309
6,494,221 B1 * 12/2002 Sellmer ............... H01L 21/6708
134/147
(Continued)

FOREIGN PATENT DOCUMENTS

EP  1067591 A2  1/2001
EP  1005064 B1  9/2001
(Continued)

OTHER PUBLICATIONS

FR-2789224-A1, Machine Translation (Year: 2024).*

*Primary Examiner* — Duy Vu N Deo
*Assistant Examiner* — Christopher Remavege
(74) *Attorney, Agent, or Firm* — Murphy, Bilak & Homiller, PLLC

(57) ABSTRACT

A method for producing an edge structure of a semiconductor component includes: providing a semiconductor body having at least two mutually spaced-apart main faces respectively having an edge, between which edges an edge face extends; and etching a predetermined edge contour by purposely applying a chemical etchant onto the edge face by an etchant jet with simultaneous rotation of the semiconductor body about a rotation axis. The etchant jet is guided with a predetermined jet cross section, while being directed tangentially with respect to the edge face, such that the etchant jet impinges on the edge face only with a part of the jet cross section. A corresponding device for producing an edge structure of a semiconductor component is also described.

13 Claims, 6 Drawing Sheets

(58) Field of Classification Search
CPC ......... H01L 29/66136; H01L 29/66363; H01L 29/74; H01L 29/861; H01L 21/67075
See application file for complete search history.

(56) References Cited

U.S. PATENT DOCUMENTS

| | | | | |
|---|---|---|---|---|
| 7,935,217 | B2* | 5/2011 | Yashiki | H01L 21/681 |
| | | | | 134/113 |
| 2004/0089840 | A1* | 5/2004 | Parent | C09K 13/08 |
| | | | | 252/79.1 |
| 2004/0140287 | A1* | 7/2004 | Bogart | H01L 21/67028 |
| | | | | 216/2 |
| 2018/0068875 | A1* | 3/2018 | Takeaki | H01L 21/67023 |

FOREIGN PATENT DOCUMENTS

| | | | | |
|---|---|---|---|---|
| EP | 2591495 | B1 | 4/2019 | |
| FR | 2789224 | A1 * | 8/2000 | ....... H01L 21/02021 |
| GB | 1031043 | * | 5/1966 | |
| GB | 1031043 | A | 5/1966 | |
| JP | S62287624 | A | 12/1987 | |
| JP | S62287625 | A | 12/1987 | |
| JP | H07335730 | A | 12/1995 | |

* cited by examiner

METHOD AND DEVICE FOR PRODUCING AN EDGE STRUCTURE OF A SEMICONDUCTOR COMPONENT

TECHNICAL FIELD

The present disclosure relates to a method for producing an edge structure of a semiconductor component and further relates to a device for producing an edge structure of a semiconductor component.

BACKGROUND

Edge structures of semiconductor components, in particular power semiconductor components, are used in a known way to increase the blocking capability of highly blocking semiconductor components, for example diodes, thyristors, IGBTs and the like, by reducing the maximum electric field strengths which usually occur in the superficial edge region of the component, in order to achieve a maximally homogeneous distribution of the electric field in the component and therefore a maximally high dielectric strength of the power semiconductor component.

Often, such edge terminations are produced by removing a part of the semiconductor body in its edge region, for example in the region of a radially outer circumferential face of the semiconductor body, in order to advantageously influence the profile of the electric field in the edge region. In particular, a certain angle is adjusted in the edge region of the semiconductor body by an edge chamfer, at which angle, for example, a pn junction intersects the semiconductor surface of the edge chamfer, so that the edge is relieved of electric field strengths.

In order to achieve a maximally high dielectric strength of the component, it is crucial to comply as accurately as possible with a predetermined shape during the production of such an edge termination. The method steps used for this are expensive, on the one hand, and on the other hand exact reproducibility of the predetermined shape often turns out to be difficult. In conventional methods, such edge terminations are produced by a multiplicity of working steps, the semiconductor body initially being chamfered in a first working step, typically mechanically, for example by grinding or lapping, and subsequently polished in one or more chemical working steps, for example by dip etching or spin etching methods, until the desired dielectric strength is achieved. In particular, the expense of such chemical method steps is increased by the fact that the regions of the semiconductor body which must in no case be etched need, for example, to be protected against an etching action by a mask.

Depending on the desired blocking properties or dielectric strength and the volume of the component, a dip etching method may be used for the chemical polishing. One problem in this case, however, is the lower process stability because of acid contamination. Alternatively, a manual spin etching process may be used, although the process stability is likewise not optimal because of the large influence of the mechanical preprocessing and the user influence, and the cost efficiency for mass products is lower.

Most components in which molybdenum is bonded to the silicon of the semiconductor body by sintering or alloying are given a positive-negative edge contour. A negative angle is disadvantageous since it requires narrow process tolerances. Furthermore, the usually very shallow angle (about 1-5°) requires a comparatively large silicon area and consequently enlarges the edge region of the component.

In an alternative planar concept for power components, the alloying and the mechanical chamfering may be obviated. Here, however, the problem arises that the yield for large-area components is very low because of the typical defect density in the lithography process.

Besides the alloying technique, a so-called free-floating technique is furthermore known, which is likewise based on mechanical chamfering of the component edge after laser cutting and etching by means of a manual process of spin etching the semiconductor body.

EP 2 591 495 B1 describes a method for producing an edge structure of a semiconductor component, with which an edge region having a positive and/or negative angle can be produced with high accuracy and good reproducibility.

SUMMARY

Against this background, an object is to provide a method and a device for producing an edge structure of a semiconductor component, which allows economical and efficient production of a predetermined edge structure, i.e. contour of an edge region or edge face, of the semiconductor component with high accuracy and reproducibility, in order inter alia to ensure a high yield in the large-scale production of semiconductor components in respect of desired electrical, mechanical or geometrical properties. Furthermore, the electrical properties of the components which are achievable by means of the edge structure produced according to the method are intended to be maximally stable in relation to inherently unavoidable variations in the production process. In addition, the necessary working steps should be both efficiently executable and reduced overall in terms of their number.

It should be pointed out that the features individually mentioned in the claims may be combined with one another in any desired technically feasible way (even across category boundaries, for example between the method and the device) and represent further configurations. The description additionally characterizes and specifies embodiments particularly in connection with the figures.

It should furthermore be pointed out that a conjunction "and/or" used herein, standing between two features and linking them, is always to be interpreted as meaning that in a first configuration of the subject only the first feature may be present, in a second configuration only the second feature may be present, and in a third configuration both the first and the second feature may be present.

In addition, a term "about" as used herein is intended to indicate a tolerance range which seems usual to a skilled person working in the present field. In particular, the term "about" is intended to be understood as a tolerance range of the relevant quantity of up to at most +/−20%, preferably up to at most +/−10%.

Furthermore, relative terms used herein in relation to a feature, for example "larger", "smaller", "higher", "lower", "faster", "slower" and the like, are always to be interpreted as meaning that production-related and/or execution-related size deviations of the relevant feature, which lie with in the manufacturing/execution tolerances defined for the manufacturing or execution of the respective feature, are not included by the respective relative term. In other words, a size of a feature is to be regarded as "larger", "smaller", "higher", "lower", "faster", "slower" and the like than a size of a comparative feature only if the two comparative sizes differ from one another so significantly in their value that this size difference reliably does not fall within the manufacturing/execution-related tolerance range of the relevant feature, but is the result of purposeful action.

According to an embodiment, a method for producing an edge structure of a semiconductor component, for example diodes, thyristors and the like, comprises the steps:

providing a semiconductor body, which comprises at least two mutually spaced-apart main faces respectively having an edge, between which edges an edge face extends, and etching a predetermined edge contour by purposely applying a chemical etchant onto the edge face by means of an etchant jet with simultaneous rotation of the semiconductor body about a rotation axis.

Furthermore, according to an embodiment the etchant jet is guided with a predetermined jet cross section, while being directed tangentially with respect to the edge face, in such a way that the etchant jet impinges on the edge face only with a part of its jet cross section.

An edge contour is to be understood in the sense according to an embodiment as an outline of the semiconductor body in its edge region, which can be defined in a cross section of the semiconductor body. The edge contour defines the profile of the edge face in the edge region of the semiconductor body. In this case, in particular, the profile is to be understood as being substantially perpendicular to tangential direction established by rotation of the semiconductor body (also referred to herein as the circumferential direction of the semiconductor body or of the edge face).

In the ideal (mathematical) case, a tangent is a straight line which touches a given curve (in particular a curve of the edge face) at a particular point. Since, however, the etchant jet does not strictly speaking describe a straight line in the mathematical sense and furthermore has a two-dimensional diameter (i.e. jet cross section), the etchant jet guided while being directed tangentially with respect to the edge face is to be understood as meaning a geometrical relation between edge face and etchant jet such that a part of the etchant jet (i.e. a part of the jet cross section) touches a point of an a really extended region of the edge face (also referred to herein as an impingement point). The part of the etchant jet not touching the impingement point of the edge face passes the edge face without substantially being involved in a direct chemical etching action on the edge face. The etchant jet therefore impinges on the edge face not with its entire jet cross section but only with a part thereof.

The above-described tangential alignment of the etchant jet with respect to the edge face allows purposeful monitoring and control, for example reduction, of conventionally substantially uncontrollable spreading of the etchant jet after the impingement on the edge face due to splatter of the etchant away from the impingement point. The impingement point of the etchant on the edge face, which corresponds substantially to a wetting region in which the etchant exerts its etching action directly on the semiconductor body, is according to an embodiment purposely delimitable very accurately locally. Furthermore, it effectively prevents the etchant impinging on the edge face from inadvertently and uncontrolledly reaching the main faces of the semiconductor body and thereby damaging them. Application of a mask onto regions not to be etched, for example main faces, or an upper and/or lower side of the semiconductor body, may therefore be obviated so that the number of method steps required is reduced and the method can be carried out more simply overall.

The tangential guiding as disclosed here of the etchant jet to the edge region to be etched of the semiconductor body may be automated with corresponding control means and optionally sensor means, so that it is possible to ensure highly accurate reproduction of the edge structure which imparts the predetermined electrical, mechanical and geometrical properties to the component to be produced. The edge chamfer may therefore be produced fully by the etching process, without for example mechanical pretreatment and/or after-treatment of the edge face being necessary. The high level of automation increases the efficiency of the component manufacture because of short treatment cycles, which is a particular advantage especially for the production of large production numbers. The component manufacturing costs may be reduced significantly.

The semiconductor body may be geometrically configured substantially rotationally symmetrically in relation to the rotation axis, that is to say for example (circular) cylindrically or in the shape of a disk. In the case of a cylindrical or disk-shaped body, its two base faces, i.e. its upper and lower sides, may respectively form one of the main faces, and the lateral face of the cylindrical or disk-shaped body, or a part of the lateral face, may form the edge face. The embodiments described herein are not, however, necessarily restricted to such a configuration and arrangement of the respective faces.

The semiconductor component may preferably be a symmetrically blocking bipolar component (i.e. comprising at least two pn junctions), for example a thyristor, or an asymmetrically blocking, in particular bipolar component (i.e. comprising only one pn junction), for example a diode and the like, and may be configured for blocking voltages of for example about 3.6 kV or more, without necessarily being restricted thereto.

The main faces of the semiconductor body may for example be configured as cathode and anode faces, for example of a thyristor, a diode and the like, the embodiments described herein not necessary being restricted thereto. The edge face of the semiconductor body may extend as an outer circumferential face between the anode and cathode faces.

Particularly advantageously, the method may be used for the large-scale manufacture of semiconductor components with a production number of for example about 25000 per year or more.

According to one advantageous refinement, as the edge contour, an edge chamfer whose profile is different to an original contour profile of the edge face existing before the etching, considered macroscopically, is etched by means of the etchant jet. In other words, the material ablation caused by the etching action of the etchant in the edge region of the semiconductor body is not the same everywhere. Rather, the material ablation is greater/less in one section of the edge region than in another section of the edge region.

In contrast thereto, a substantially constant material ablation over the entire edge face does not vary its original edge contour existing before the etching process, considered macroscopically.

The material ablation in the edge region of the semiconductor body caused by the etching may be constant in some sections and not constant in other sections, so that the etched edge contour does however differ from the original edge contour in its profile. Constant material ablation allows the formation of a straight edge contour in the non-circumferential/non-tangential direction of the semiconductor body (correspondingly, in the radial and/or axial direction). The material ablation caused by the etching in the edge region may likewise not be constant over the entire edge region in the non-circumferential/non-tangential direction, so that a curved, arcuate profile of the edge contour may be provided in the non-circumferential/non-tangential direction of the semiconductor body.

If the extent of the desired material ablation in the edge region in the radial direction of the semiconductor body is more than the maximum jet cross section of the etchant jet, the etchant jet may be scanned in the radial direction while preserving its tangential alignment with respect to the edge face. For this purpose, the etchant jet may for example be displaced in space translationally and/or rotationally in the radial direction with respect to the edge face. The scanning speed of the etchant jet may in this case be selected in such a way that it follows the contour resulting from the etching action in the edge region.

In addition or as an alternative to the above-described radial displacement of the etchant jet, a desired material ablation in the edge region may be carried out in the axial direction of the semiconductor body, by the etchant jet being displaced translationally and/or rotationally in the axial direction of the semiconductor body in order to vary the impingement point of the etchant jet on the edge region in the axial direction of the semiconductor body (i.e. substantially parallel to the rotation axis).

In another advantageous configuration, the etched edge chamfer is a so-called double-positive edge chamfer. The double-positive edge chamfer is characterized in that in relation to the main faces which delimit the edge face, it is recessed into the interior of the semiconductor body, for example in the manner of a flute, groove, hollow or the like. In the case of the double-positive edge chamfer, the main faces of the semiconductor body may advantageously be preserved substantially (fully) in terms of area. The formation of the double-positive edge chamfer requires a significantly smaller silicon region of the semiconductor body than, for example, a so-called negative or positive-negative edge chamfer, the formation of which is always associated with a substantial reduction of the main faces.

Furthermore, the electrical properties of the semiconductor component which can be achieved with the double-positive edge chamfer are adjustable significantly more stably even when process variations (i.e. process tolerances) occur, so that the method can be simplified even further in its conduct without having a disadvantageous effect on the quality of the semiconductor components produced. A high yield may furthermore be ensured.

The double-positive edge chamfer may be arranged and configured substantially symmetrically in relation to a thickness of the semiconductor body (i.e. a distance between the main faces) and centrally between the main faces. The embodiments described herein are not, however, necessarily restricted thereto. The edge chamfer may also be arranged and/or configured off-center between the main faces and/or asymmetrically.

Correspondingly, according to an alternative configuration, the etched edge chamfer is an asymmetrical edge chamfer.

According to another advantageous refinement, the edge contour is etched in at least two different etching steps, for example a first etching step and a second etching step, at least one parameter from the group consisting of a diameter of the jet cross section, a volume flow rate of the etchant jet, i.e. the volume of the etchant which is transported through an established cross section per length of time, and a rotational speed of the semiconductor body being varied between the etching steps.

For example, the diameter of the jet cross section may purposely be selected to be smaller during the first etching step than the diameter of the jet cross section during the second etching step. The smaller jet cross section makes it possible to greatly limit the spreading of the etchant jet after impingement on the edge face, so that the etching action can purposely be limited to a very narrow region of the edge face. Furthermore, the smaller jet cross section increases the degree of freedom in the production of a specific shape of the edge contour. The desired profile of the edge contour may be introduced dependably and accurately into the edge face.

In the second etching step, the spreading of the impinging etchant jet may purposely be increased by enlarging the jet cross section. In this way, running traces of the etchant possibly formed during the first etching step and/or inhomogeneities in/on the edge face may effectively be eliminated. The wider jet cross section may, without necessarily being restricted thereto, preferably be selected in the second etching step in such a way that the etchant jet wets substantially the entire surface of the etched edge contour and achieves homogenization (for example smoothing) of the etched edge face because of the etching action now exerted uniformly on the entire edge face.

In any event, the larger jet cross section leads to a more homogeneous etching action and may in this way advantageously be used for the polish etching of the edge face, i.e. for the chemical removal of roughness peaks on the surface of the edge face. Particularly preferably, the polish etching with a large jet cross section of the etchant jet may be carried out as a concluding last etching step after one or more preceding etching steps. Additional or alternative possibilities for purposeful enlargement of the spreading are given by the rotational speed and the volume flow rate (described below). These may therefore likewise be used for the polish etching of the edge face.

Particularly preferably, the edge face may be at least partially smoothed in a first etching step. For this purpose, the spreading of the impinging etchant jet may advantageously be increased, for example by a larger jet cross section than for example during the etching of the edge chamfer itself. Additional or alternative possibilities for purposeful enlargement of the spreading are given by the rotational speed and the volume flow rate (described below). These may therefore likewise be used for smoothing the edge face.

During the preferred formation of the double-positive edge chamfer, the flute- or groove-like depression may initially be introduced into the edge face with the smaller jet cross section, the etchant jet with a larger diameter in the second etching step additionally being delimited by the lateral flanks of the flute- or groove-like double-positive edge chamfer and correspondingly being guided in a controlled way.

As an alternative or in addition to varying the jet cross section, the rotational speed with which the semiconductor body is rotated during the etching process may be selected, for example, to be larger during the first etching step than the rotational speed, for example, during the second etching step (or vice versa). The higher rotational speed of the semiconductor body likewise leads to strong delimitation of the spreading of the etchant jet after impingement on the edge face. In the second etching step, greater spreading of the etchant jet may purposely be allowed by reducing the rotational speed in order to achieve the effect already described above (i.e. homogenization, smoothing).

As an alternative or in addition to varying the jet cross section and/or varying the rotational speed of the semiconductor body, the volume flow rate of the etchant jet may be selected, for example, to be less during the first etching step than the volume flow rate, for example, during the second etching step (or vice versa). By applying the smaller amount of etchant in the first etching step, the spreading of the etchant jet after impingement on the edge face is limited greatly. In the second etching step, greater spreading of the etchant jet may purposely be allowed by the larger amount of etchant per unit time in order to achieve the advantageous effect of homogenization or smoothing of the edge contour.

According to yet another configuration, the maximum jet cross section of the etchant jet to be delivered is limited to a diameter of at most about 50%, preferably between about 10% and about 30%, of a spacing of the edges of the respective main faces delimiting the edge face. The spacing may, for example, correspond to a thickness of the semiconductor body if the main faces of the semiconductor body are arranged substantially parallel at a distance from one another. This delimitation of the jet cross section may, in combination with the subdivision of the overall etching process into the first and second etching steps described herein, apply particularly advantageously for the first etching step, in which the jet cross section is selected to be smaller than in the second etching step. Although with an etchant jet delimited in cross section in this way, with which the profile of the edge contour can be formed precisely, running traces (i.e. inhomogeneities) on the semiconductor surface are initially formed, these may nevertheless be eliminated effectively with a larger jet cross section of the etchant jet, as already described elsewhere.

According to one advantageous refinement, as the edge contour, at least a part of the edge face is only smoothed by means of the etchant jet, an original contour profile of the smoothed part of the edge face, existing before the etching, remaining unchanged, considered macroscopically. In other words, in the case of pure smoothing only a small region of the edge face is chemically ablated in order to smooth the edge surface. For example, a rough edge surface (also referred to as damage) may have been formed by cutting (for example laser cutting) of the semiconductor component in a preliminary process, i.e. before the actual etching process. This damage may advantageously likewise be removed by the method disclosed herein. In order to remove the damage or the surface roughness of the edge surface, the jet cross section may preferably have a larger diameter than, for example, when etching an edge chamfer. The larger jet cross section leads to a more homogeneous etching action than a jet cross section with a smaller diameter.

If the entire edge face is exclusively smoothed, the profile of the edge contour is substantially not changed by the etching, considered macroscopically, since the damage is merely removed uniformly over the entire edge face. If, however, only a part of the edge face is smoothed and an edge chamfer, for example the double-positive edge chamfer, is additionally introduced into the edge face, the profile of the edge contour in the region of the introduced edge chamfer is changed by the etching in comparison with the original profile of the edge contour in this region.

Advantageously, a rotation direction of the semiconductor body at an impingement point of the etchant jet on the edge face is substantially the same as a jet direction of the etchant jet. In other words, the tangential directions of the rotational movement and of the etchant jet substantially coincide at the impingement point so that the spreading of the etchant jet impinging on the edge face at the impingement point can be controlled very accurately in the manner disclosed herein.

In addition or as an alternative, an additive may be added to the etchant in order to reduce its surface tension, so that the wetting properties of the etchant jet when impinging on the edge face, for example the areal size of the edge face wettable by the etchant during the contact time, i.e. after impingement and before the subsequent spinning off, the spreading of the etchant jet after impingement on the edge face, and the like, can be purposely influenced.

According to one preferred configuration, the rotation axis is aligned substantially vertically in space. According to an alternative configuration, the rotation axis is aligned substantially horizontally in space. In both configurations, the effect of the force of gravity may additionally be used to reinforce the properties and effects according to the embodiments described herein, depending on the arrangement of the edge face to be etched. For example, the force of gravity may additionally be used to purposely influence the running or spinning off of the etchant applied onto the edge face and/or the residence time (i.e. action time) of the etchant on the edge face. Due to the effect of the force of gravity, it may likewise be possible to have to rotate the semiconductor body with a vertical arrangement of the rotation axis with a higher speed than with a horizontal arrangement of the rotation axis, for example in order to cause sufficiently rapid spinning off of the etchant after application onto the edge face and thereby reduce or prevent undesired flow of the etchant on the edge face influenced by the effect of the force of gravity. On the other hand, a lower rotational speed may advantageously be used to rotate semiconductor bodies with a larger diameter in order to reduce the centrifugal forces acting on the semiconductor body.

According to another aspect, a device for producing an edge structure of a semiconductor component comprises a rotatable carrier for holding a semiconductor body of the semiconductor component, at least one controllable nozzle for delivering an etchant jet having a predetermined jet cross section, and a control unit. The control unit is configured to control the carrier and/or the at least one nozzle by means of a method according to one of the configurations disclosed, that is to say in particular to guide the etchant jet, while being directed tangentially with respect to the edge face, in such a way that the etchant jet impinges on the edge face only with a part of its jet cross section.

It should be pointed out that in respect of device-related term definitions and the effects and advantages of features according to the device, reference may be made comprehensively to the disclosure of analogous definitions, effects and advantages of the production method as disclosed herein. That is to say, disclosures herein in respect of the production method may likewise be used analogously for the definition of the device, and vice versa, unless this is explicitly excluded. To this extent, repetition of explanations of analogously similar features, or their effects and advantages, may be omitted for the sake of a more concise description, without such omissions being interpreted as a restriction.

The nozzle may be configured to controllably vary its position and/or angular alignment in space. As an alternative or in addition, the nozzle may be configured to controllably vary properties of the etchant jet, for example jet cross section, volume flow rate, pressure and/or temperature of the etchant.

According to one advantageous configuration, a plurality of nozzles are arranged distributed, in particular equidistantly distributed, circumferentially around the carrier. For example, preferably from two to four nozzles may be arranged distributed circumferentially around the carrier. Particularly preferably, three nozzles may be arranged equidistantly distributed around the carrier. The provision of a plurality of nozzles increases the etching action, that is to say the material ablation, achievable per unit time on the edge face, so that the time for complete formation of the desired edge contour per semiconductor component may be significantly reduced further.

BRIEF DESCRIPTION OF THE DRAWINGS

Further features and advantages may be found in the following description of exemplary embodiments, not to be interpreted as restrictive, and which will be explained in more detail below with reference to the drawing. In this drawing, schematically.

DETAILED DESCRIPTION

In the various figures, parts which are equivalent in respect of their function are always provided with the same references, so that they will generally also be described only once.

Figure 1:
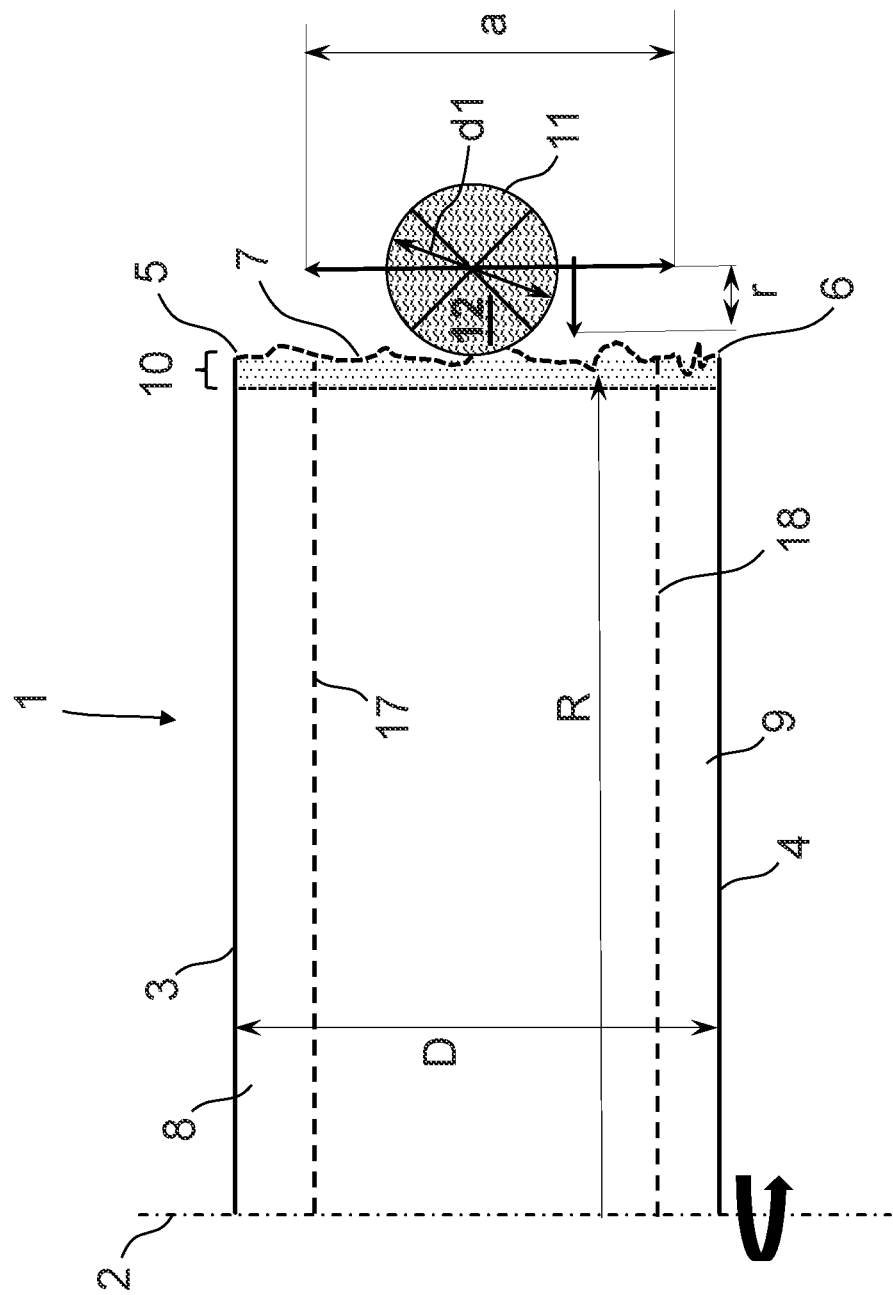
FIG. 1 shows a side view of an exemplary semiconductor body of a semiconductor component before the etching of an edge structure.

FIG. 1 represents a side view of one half of an exemplary semiconductor body 1 of a semiconductor component before the etching of an edge structure. The semiconductor component may for example be a symmetrically blocking, in particular bipolar component (i.e. for example comprising at least two pn junctions), for example a thyristor, or an asymmetrically blocking, in particular bipolar component having only one pn junction, such as a diode and the like. The embodiments described herein are not, however, necessarily restricted to semiconductor components having the aforementioned features.

In the present case, the semiconductor body 1 represented is configured substantially cylindrically. Because of its substantially rotationally symmetrical configuration, the semiconductor body 1 is represented only on one side of its midaxis 2, or symmetry axis, in FIG. 1. The midaxis 2 is at the same time a rotation axis about which the semiconductor body 1 can be rotated, as will be described in more detail below.

The semiconductor body 1 shown in FIG. 1, which by way of example is cylindrical, comprises a first disk-shaped main face 3 and a second disk-shaped main face 4. The first main face 3 may, for example, form a merely schematically indicated cathode structure 8 of the semiconductor component (for example a diode, thyristor etc.) and the second main face 4 may form a likewise only schematically indicated anode structure 9 of the semiconductor component.

For this purpose, the semiconductor regions 8 and 9 may respectively be provided in a per se well-known way with dopants in order to obtain desired conduction properties (for example p/n conduction) and/or semiconductor junctions between different conduction types (for example pn/pnp junction, etc.).

In FIG. 1, the two main faces 3 and 4 are arranged visibly spaced apart from one another, and in the present case they furthermore extend parallel, without necessarily being restricted thereto. The first main face 3 comprises a radially outer edge 5 delimiting it, and the second main face 4 comprises a radially outer edge 6 delimiting it. An edge face 7 of the semiconductor body 1 extends between the edges 5 and 6 of the two main faces 3 and 4.

The spacing of the two main faces 3 and 4 from one another corresponds in the present case to a thickness D of the semiconductor body 1. The spacing of the edge face 7 from the midaxis 2 corresponds substantially to a radius R of the semiconductor body 1.

In the semiconductor body 1 of the embodiment variant shown, two pn junctions 17 and 18 can be seen by way of example, such as may be provided in this way or any similar way in a symmetrically blocking component, for example a thyristor. The embodiments described herein are not necessarily restricted to the presence of two pn junctions. Fewer or more than two pn junctions may be provided in the semiconductor body 1. It should be pointed out that the spacing of the pn junctions 17 and 18 from the respective main faces 3 and 4 is not represented to scale.

In FIG. 1, a surface roughness of the edge face 7 is indicated by the jagged dashed line, although not to scale. The rough edge surface, which is also referred to as damage, may for example have been formed by cutting of the semiconductor body 1 in a preliminary process, i.e. before the actual etching process described below for forming an edge contour. The roughness of the edge face 7 essentially comprises an extent, which is indicated by the reference 10 in FIG. 1, in a radial direction of the semiconductor body 1.

An etchant jet 11, the jet direction of which points into the plane of the drawing, may furthermore be seen in FIG. 1. The etchant jet 11 is therefore aligned tangentially with respect to the edge face 7. The etchant jet 11 has a jet cross section 12 (substantially circular in the present case) with a diameter d1. An additive may be added to a chemical etchant forming the etchant jet 11 in order to reduce its surface tension, without necessarily being restricted thereto.

In order to etch a predetermined edge contour, i.e. a predetermined profile of the edge face 7, by material ablation at the edge face 7, the chemical etchant is purposely applied onto the edge face 7 by means of the etchant jet 11, the semiconductor body 1 simultaneously being rotated about the rotation axis 2. In the present case, the rotation direction of the semiconductor body 1 and the jet direction of the etchant jet 11 at the impingement point of the etchant jet 11 on the edge face 7 substantially coincide.

It is furthermore represented in FIG. 1 that the etchant jet 11 is guided during the etching process for forming the edge contour while being directed tangentially with respect to the edge face 7, in such a way that the etchant jet 11 impinges on the edge face 7 only with a part of its jet cross section 12. The tangential alignment of the etchant jet 11 with respect to the edge face 7 according to an embodiment makes it possible that spreading of the etchant jet 11 after impingement on the edge face 7, which is caused by splatter of the etchant away from the edge face 7, can be controlled very accurately. The etching action of the etchant on the edge face 7 may therefore be delimited very accurately locally. Furthermore, this prevents the etchant impinging on the edge face 7 from inadvertently and uncontrolledly reaching the main faces 3, 4 of the semiconductor body 1 and thereby damaging them.

In the example shown in FIG. 1, by means of the tangential guiding of the etchant jet 11, for example, the rough surface of the entire edge face 7 or only a part of the edge face 7* (as represented by way of example in FIGS. 2 and 3) may be smoothed, the contour profile of the edge face 7 after the smoothing corresponding substantially (i.e. considered macroscopically) to the contour profile of the edge face 7 before the smoothing, i.e. both the original rough edge contour and the smoothed edge contour in the present case extend substantially parallel to the midaxis 2.

In order to be able to smooth the entire edge face 7 with the etchant jet 11, the diameter d1 of which is less than the thickness D of the semiconductor body 1, preferably at most 50% of the thickness D of the semiconductor body 1 or even more preferably at most from 10% to 30% of the thickness D, the etchant jet 11 may be displaced in the present exemplary embodiment in an axial displacement direction a of the semiconductor body 1. For example, for this purpose a nozzle (not represented in FIG. 1) for delivering the etchant jet 11 may be translationally and/or rotationally displaced in space in order to vary the impingement point of the etchant jet 11 on the edge region 7 in the axial direction of the semiconductor body 1 (i.e. substantially parallel to the midaxis or rotation axis 2).

In order to achieve material ablation at the edge face 7 in the entire semiconductor region 10 of the semiconductor body 1, the etchant jet 11 may likewise be displaced in a radial displacement direction r in space. For this purpose, the nozzle (not represented in FIG. 1) for delivering the etchant jet 11 may also be translationally and/or rotationally displaced in space. The scanning speed of the etchant jet 11 in the radial direction r is in this case preferably selected in such a way that it constantly follows the contour of the edge face 7 resulting from the etching action while maintaining its tangential alignment as described herein with respect to the edge face 7.

In the exemplary embodiment shown here, the rotation axis 2 is aligned vertically in space, without necessarily being restricted thereto. For example, the rotation axis 2 may also be rotated by 90° with respect to the direction of the rotation axis 2 shown in FIG. 1, that is to say it may be aligned horizontally in space.

Figure 2:
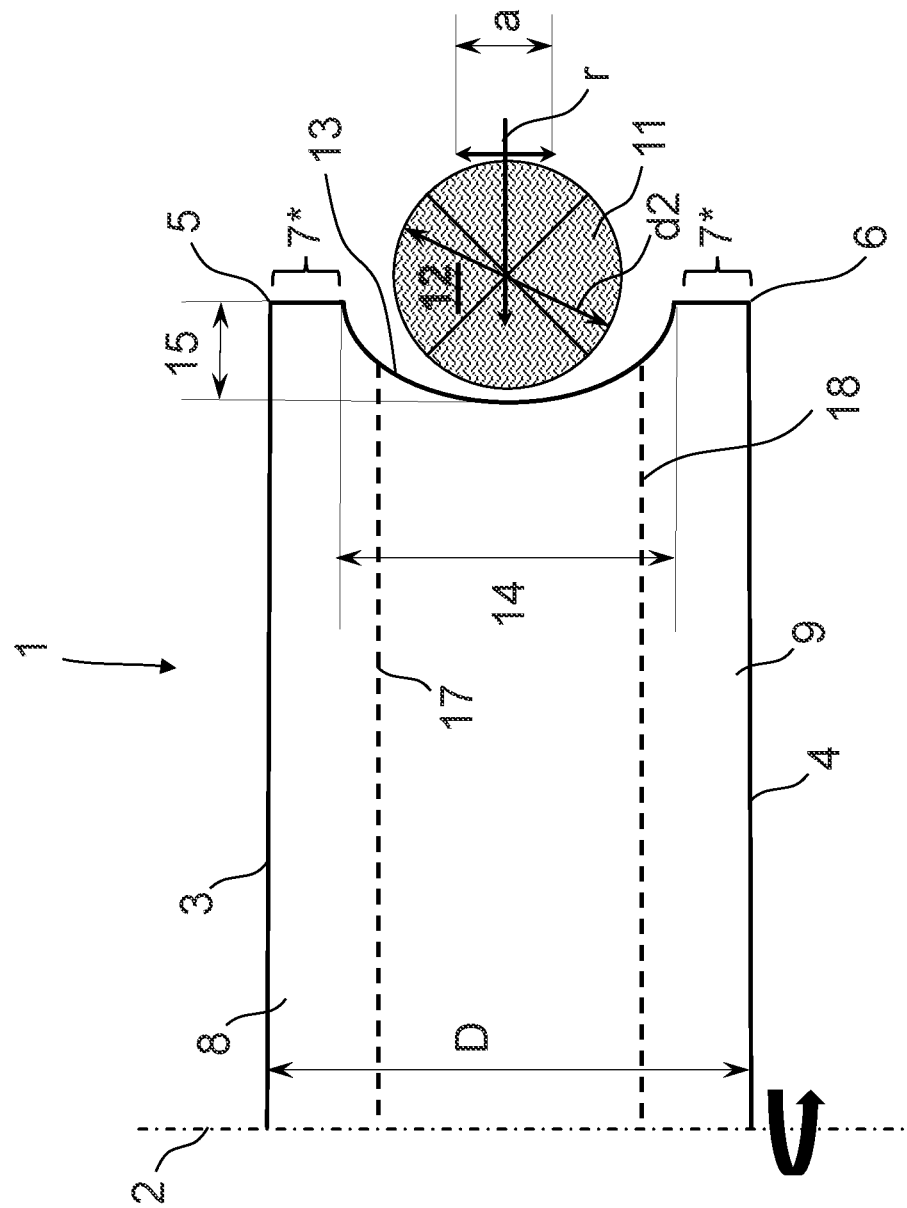
FIG. 2 shows an intermediate step in a side view of the semiconductor body 1 of FIG. 1 after partial implementation of an exemplary method for producing an edge structure according to an embodiment.

FIG. 2 represents, in a side view of the semiconductor body 1 of FIG. 1, an intermediate step after partial implementation of an exemplary method for producing an edge structure according to an embodiment. It may be seen that a part 7* of the edge face 7 has initially been smoothed as explained above with reference to FIG. 1. Furthermore, a part of an edge chamfer 13 whose profile is different, considered macroscopically, to the original contour profile of the edge face 7 present before the etching has been etched with the aid of the etchant jet 11. The edge chamfer 13 shown in FIG. 2 is, by way of example, a double-positive edge chamfer. It is set back in the radial direction relative to the main faces 3 and 4, and therefore directed into the interior of the semiconductor body 1, in the form of a flute, groove, hollow or the like. In the intermediate step represented in FIG. 2, a first section of the edge chamfer 13 was etched with the etchant jet 11 and a jet diameter d2. For this purpose, the etchant jet 11 was displaced both in the axial movement direction and in the radial movement direction r, respectively relative to the semiconductor body 1, as already explained in connection with FIG. 1. In the example represented here, the jet diameter d2 was selected to be greater than the jet diameter d1 used only for the smoothing in FIG. 1. The larger jet diameter d2 allows rapid material ablation during the formation of the double-positive edge chamfer 13, which is open toward the edges 5 and 6 of the respective main faces 3 and 4, a homogeneous etching action being achievable at the same time over a relatively wide region of the edge face 7. The jet diameter d2 may, for example, be established via a correspondingly controllable diameter of a nozzle opening (not represented) or by selection of a separate nozzle (likewise not represented) having a corresponding nozzle diameter. The volume flow rate of the etchant jet 11 may in this case likewise be adapted accordingly. As represented in FIG. 2, in the intermediate state, the edge chamfer 13 has a maximum height 14 and a temporary depth 15, which is measured from the edges 5, 6 of the respective edge faces 3 and 4.

It should be mentioned that the part 7* of the edge face 7 need not necessarily be provided. In the extreme case, it is also possible for the maximum height 14 of the edge chamfer 13 to be selected to be equal to the thickness D of the semiconductor body 1, so that the part 7* of the edge face 7 is not present.

In FIG. 2, it may be seen that the pn junctions 17, 18, of which there are two in the present case, respectively intersect the curved edge contour of the edge chamfer 13, for which reason the edge chamfer 13 is to be referred to as a double-positive edge chamfer and has the advantages explained herein. The embodiments described herein are not, however, necessarily restricted to the double-positive edge chamfer 13. It is in principle also possible to produce other edge chamfers, such as may for example be used for asymmetrically blocking components, for example diodes, which possibly have only one pn junction 17 or 18 (cf. FIG. 4).

Figure 3:
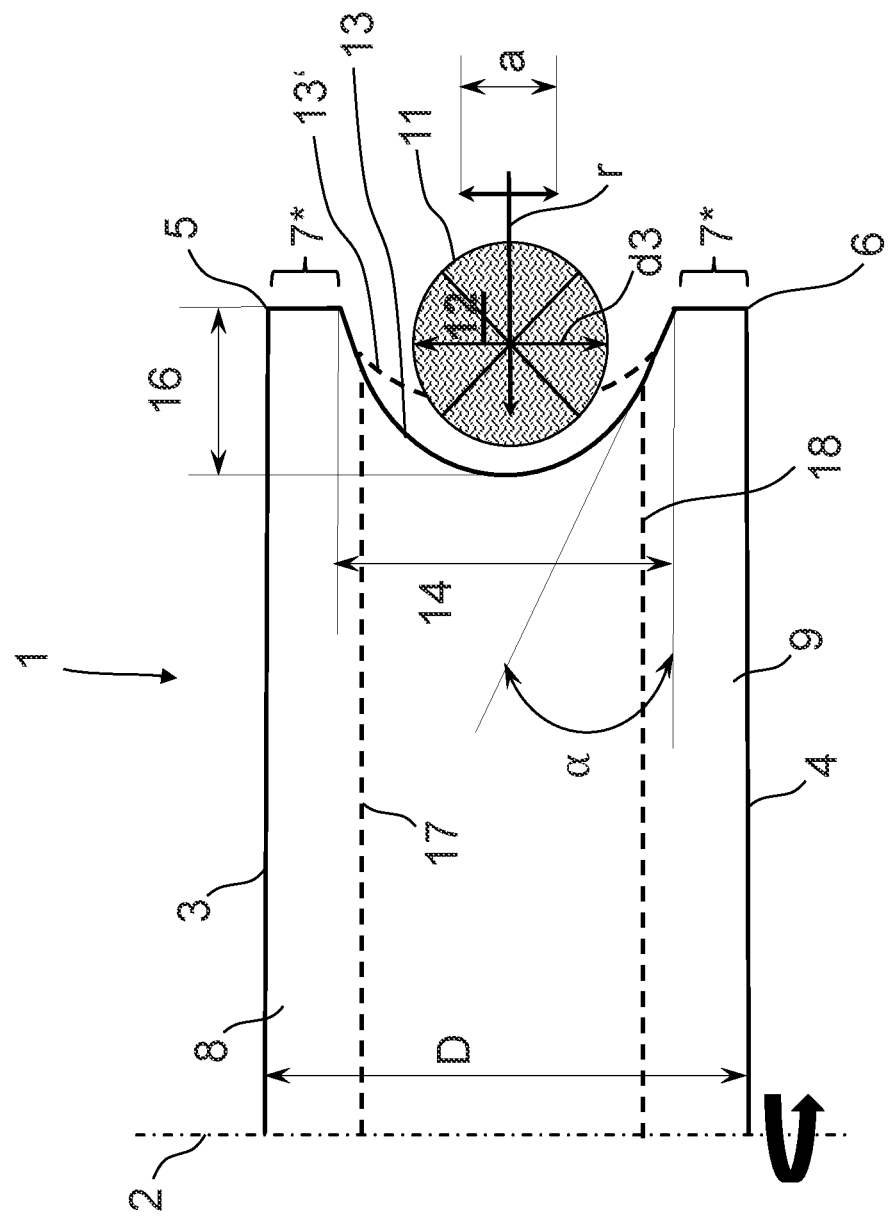
FIG. 3 shows a side view of the semiconductor body of FIG. 2 with the fully finished edge structure according to the exemplary embodiment of the method according to the embodiment of FIG. 2.

FIG. 3 represents a side view of the semiconductor body 1 of FIG. 2 having the fully finished edge structure according to the exemplary embodiment of the method according to the embodiment of FIG. 2. It may be seen that the edge chamfer 13 has reached a final depth 16, which is greater than the temporary depth 15 in FIG. 2. For a better comparison, FIG. 3 additionally shows the profile of the edge chamfer 13' of FIG. 2 as a dashed line. The maximum width 14 in the finally formed state of the edge chamfer 13 may be substantially unchanged relative to the intermediate state of FIG. 2. Even though this represents a preferred variant, the embodiments described herein are not necessarily restricted thereto, i.e. the width 14 may differ between the states shown in FIG. 2 and FIG. 3, and in particular may be greater in FIG. 3 than in FIG. 2.

In order to achieve the greater depth 16 in connection with a contour profile of the edge chamfer 13, which has a smallest radius at the deepest, i.e. radially innermost, point, starting from the state in FIG. 2 a jet diameter d3 of the etchant jet 11 which is less than the jet diameter d2 in FIG. 2 was selected. With this, a desired (optimal) chamfer angle $\alpha$ at the transition of the part 7* of the edge face 7 to the start of the edge chamfer 13 may also be adjusted precisely. The angle $\alpha$ is preferably selected between about 35° and 45°. If the maximum width 14 of the edge chamfer 13 is substantially equal to the thickness D of the semiconductor body 1, the angle $\alpha$ refers to the transition from the edge 5 or 6 to the edge chamfer 13.

As explained above with the aid of FIGS. 1 to 3, the method for producing the edge structure may be subdivided into a plurality of, in particular at least two, individual etching steps which differ from one another in that at least one method parameter, which in the present exemplary embodiment related to the jet cross section or jet diameter d1, d2, d3 of the etchant jet 11, is varied between the individual etching steps. It is, however, to be understood that other method parameters, for example the volume flow rate of the etchant jet 11 and/or the rotational speed of the semiconductor body 1, may also be varied in addition or as an alternative to the jet cross section, as already explained in the general part of this description.

Unlike in the description above of the exemplary embodiment shown in FIGS. 1 to 3, the diameter of the jet cross section 12 of the etchant jet 11 during a first etching step may furthermore be selected to be less than the diameter of the jet cross section 12 during a second etching step.

As an alternative or in addition, the rotational speed of the semiconductor body 1 during a first etching step may be selected to be greater than the rotational speed during a second etching step.

As an alternative or in addition, the volume flow rate of the etchant jet 11 during a first etching step may be selected to be less than the volume flow rate during a second etching step.

These and other combinations of etching steps having different method parameters and a different execution sequence may be envisaged, and are likewise included by the present disclosure.

Figure 4:
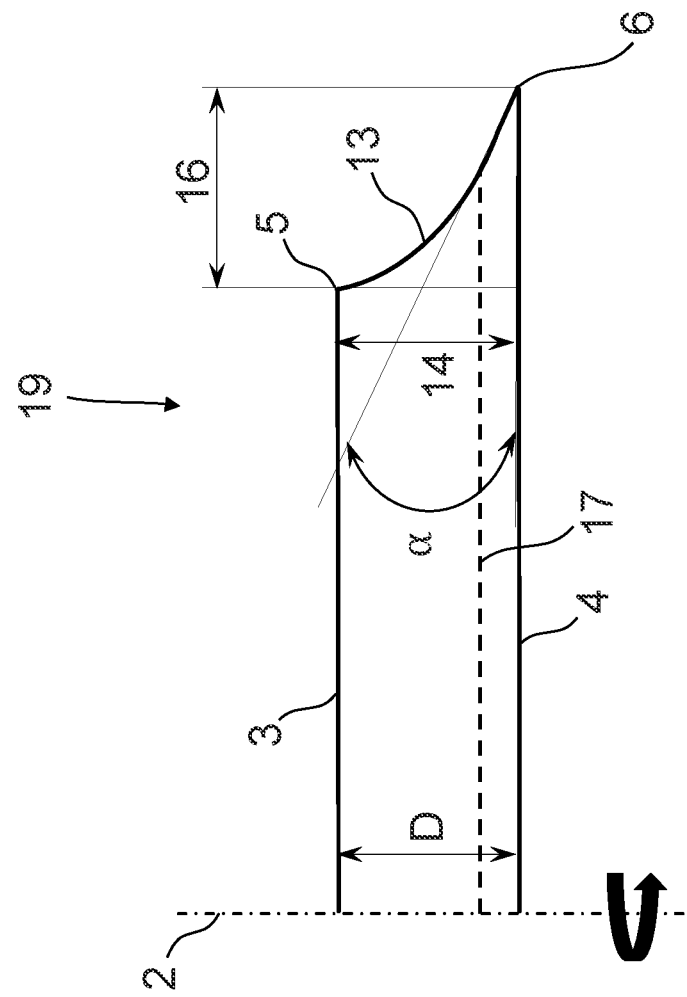
FIG. 4 shows a side view of an exemplary semiconductor body of a semiconductor component with a fully finished alternative edge structure according to an exemplary embodiment of the method according to an embodiment.

FIG. 4 represents a side view of an exemplary semiconductor body 19 of a semiconductor component, having a fully finished alternative edge structure 13 according to an exemplary embodiment of the method according to an embodiment. It may be seen from FIG. 4 that the etched edge chamfer 13 in this case is an asymmetrical edge chamfer and, without necessary restriction thereto, in particular an edge chamfer having a positive angle. It is to be understood that the end state of the etched edge chamfer 13 as represented in FIG. 4 may be produced by means of the etching method disclosed here according to an embodiment from a semiconductor body 1 such as is represented, for example, in FIG. 1.

The asymmetrical edge chamfer 13 represented in FIG. 4 may advantageously be used in semiconductor components which have only one pn junction, for example a single pn junction 17 (in the present case assigned to the second main face 4), for example a diode (i.e. an asymmetrically blocking component). In the case of a symmetrically blocking component having at least two pn junctions, for example a thyristor, the symmetrical edge chamfer 13 represented in FIG. 3 is preferably provided in the semiconductor body 1.

Figure 5:
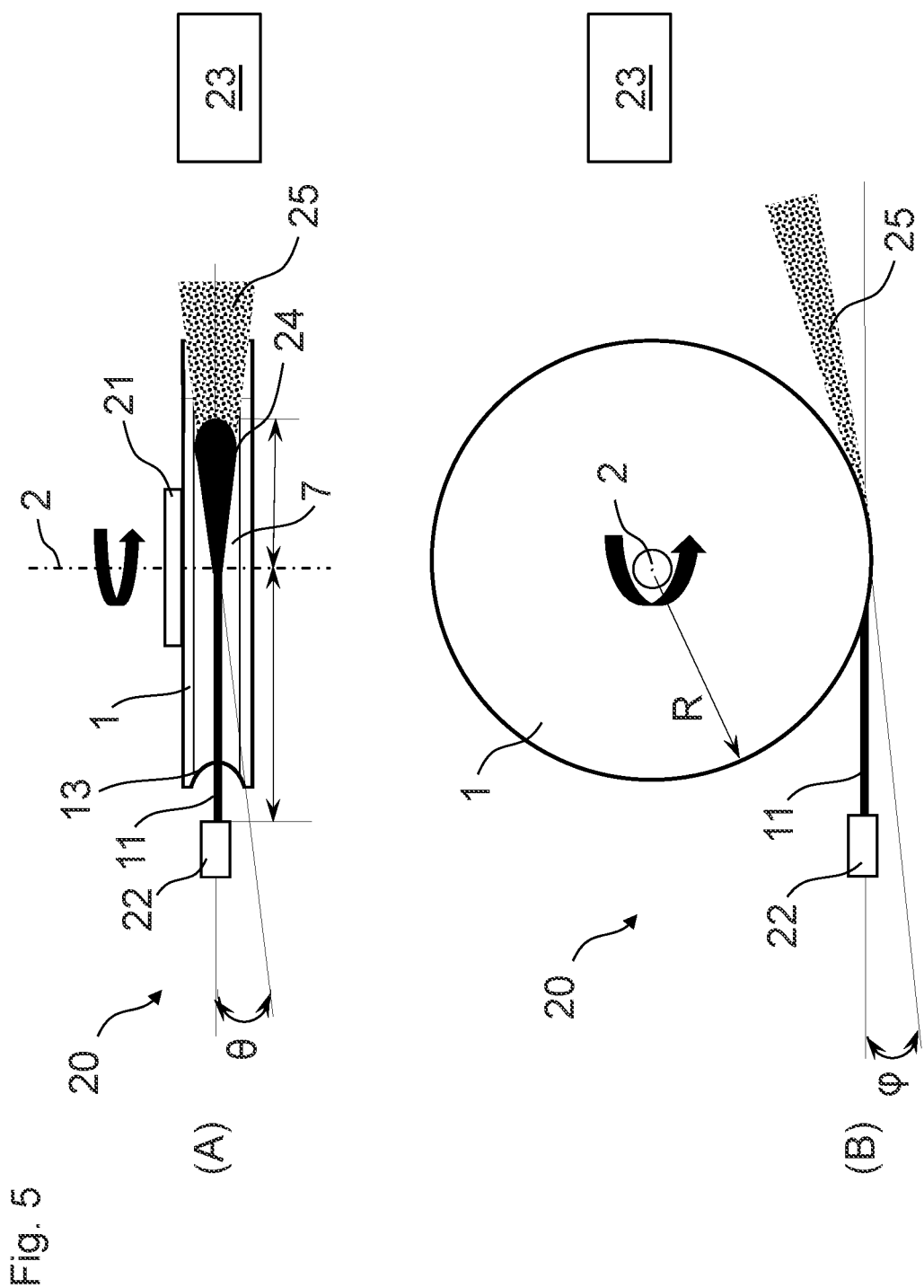
FIG. 5 shows a side view (A) of an exemplary embodiment of a device for producing an edge structure according to an embodiment and a plan view (B) of the device in view (A)

FIG. 5 represents a side view A of an exemplary embodiment of a device 20 for producing an edge structure of a semiconductor component according to an embodiment, as well as a plan view B of the device 20 of view A. It may be seen that the exemplary device 20 comprises a rotatable carrier 21 for holding a semiconductor body, for example the semiconductor body 1, of the semiconductor component, at least one controllable nozzle 22 for delivering an etchant jet, for example the etchant jet 11, having a predetermined jet diameter 12, as represented for example in FIGS. 1 to 3, and a control unit 23. The control unit 23, which comprises for example an electronic calculation and memory unit, is configured to control the carrier 21 and/or the at least one nozzle 22 in order to carry out a method according to an embodiment as disclosed herein. In particular, the nozzle 22 may for this purpose be configured to controllably vary its position and/or angular alignment in space and/or to controllably vary properties of the etchant jet 11, such as jet cross section, volume flow rate, pressure and/or temperature of the etchant delivered.

The rotation axis 2 of the device 20 shown in FIG. 5 is, by way of example, aligned vertically in space. As represented in FIG. 5, an alignment of the nozzle 22 in space is controllable (rotational displacement) both in a horizontal angle φ (view A) and in a height angle θ (view B). A translational displacement of the nozzle 22 may be provided, although this is not absolutely necessary.

In an alternative configuration which is not represented, merely a translational displacement of the at least one nozzle for delivering the etchant jet 11 may be provided, and a rotational displacement may be obviated.

Furthermore, significant spreading 24 of the etchant jet 11 after impingement on the edge face 7 of the semiconductor body 1 may be seen in FIG. 5. The spreading 24 may be purposely monitored and controlled by the method according to an embodiment and the device according to an embodiment in the manner disclosed herein. After the spreading of the etchant jet 11 on the edge face 7, this etchant is spun off from the edge face 7 due to the rotation of the semiconductor body 1. The etchant spun off is denoted in FIG. 5 by the reference 25.

Figure 6:
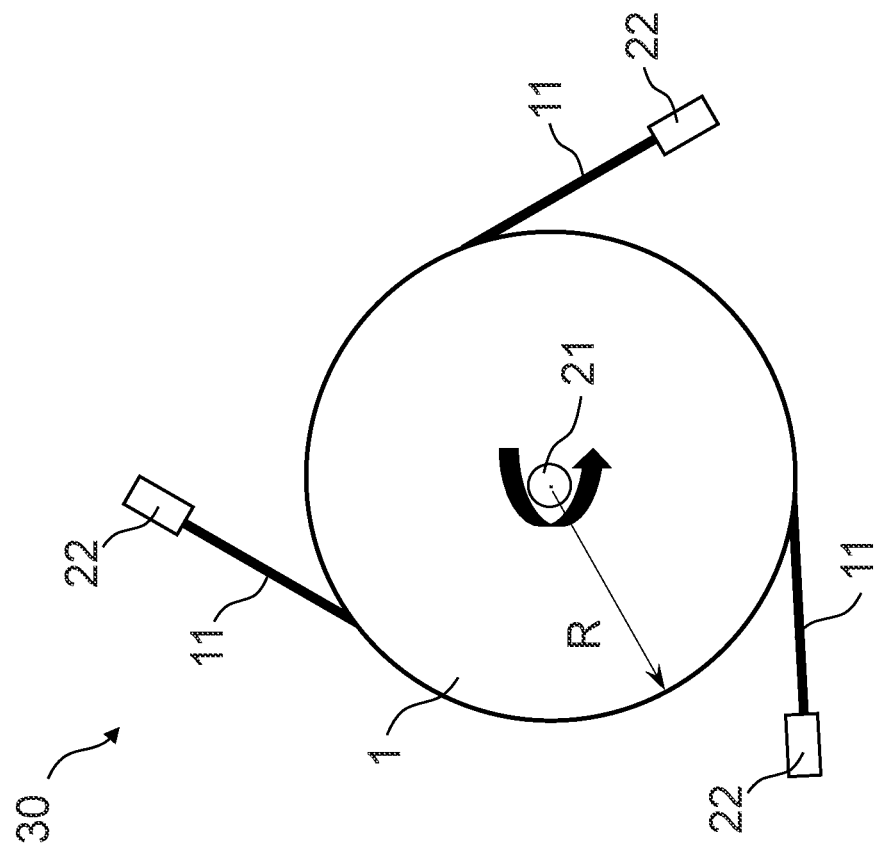
FIG. 6 shows a plan view of another exemplary embodiment of a device for producing an edge structure according to an embodiment.

FIG. 6 represents a plan view of another exemplary embodiment of a device 30 for producing an edge structure according to an embodiment. The substantial difference of the device 30 from the device 20 of FIG. 5 is that the device 30 comprises a plurality of, by way of example in the present case three, nozzles 22 arranged distributed circumferentially around the carrier 21. The nozzles 22 may advantageously be circumferentially arranged equidistantly. The nozzles 22 may, as in the case of the device 20 of FIG. 5, be configured to be controllable, in particular controllable in position (translationally) and/or angular alignment (rotationally) in space, and/or controllable in the properties of the etchant jet 11, such as jet cross section, volume flow rate, pressure and/or temperature of the etchant.

The above-described method for producing an edge structure of a semiconductor component and the device according to the invention for producing such an edge structure are not restricted to the embodiments respectively presented herein, but also include other embodiments, acting in the same way, which are derived from technically expedient further combinations of the features described herein of the respective subjects. In particular, the features and feature combinations mentioned above in the general description and the description of the figures and/or only shown in the figures may be used not only in the combinations respectively indicated explicitly herein but also in other combinations or individually, and are likewise included.

In a particularly preferred embodiment, the method and the device for producing an edge structure of a semiconductor component are used in order to form a double-positive edge chamfer at an edge face of a semiconductor body of the semiconductor component, in which case the edge face may advantageously be an outer circumferential face of the semiconductor body. The semiconductor component may preferably be a symmetrically blocking, in particular bipolar component (i.e. comprising at least two pn junctions), for example a thyristor, or an asymmetrically blocking, in particular bipolar component (i.e. comprising only one pn junction), for example a diode and the like, and may be configured for blocking voltages of for example about 3.6 kV or more. Particularly advantageously, the method and the device described herein may be used for the manufacture of semiconductor components with a production number of for example about 25000 per year or more.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

LIST OF REFERENCES 1 semiconductor body
2 midaxis, rotation axis
3 first main face
4 second main face
5 edge of the first main face
6 edge of the second main face
7 edge face
7* part of the edge face
8 cathode structure
9 anode structure
10 radial extent of the damage
11 etchant jet
12 jet cross section
13 edge chamfer (double-positive)
14 maximum height of the edge chamfer
15 intermediate depth of the edge chamfer
16 final depth of the edge chamfer
17 first pn junction
18 second pn junction
19 semiconductor body
20 device
21 rotatable carrier
22 nozzle
23 control unit
24 spreading
25 etchant spun off
30 device
α chamfer angle
θ height angle
φ horizontal angle
a axial displacement direction
D thickness
d1 first jet diameter
d2 second jet diameter
d3 third jet diameter
R radius
r radial displacement direction

What is claimed is:

1. A method for producing an edge structure of a semiconductor component, the method comprising:
providing a semiconductor body that comprises at least two mutually spaced-apart main faces respectively having an edge, between which edges an edge face extends; and
etching a predetermined edge contour by purposely applying a chemical etchant onto the edge face by an etchant jet with simultaneous rotation of the semiconductor body about a rotation axis,
wherein the etchant jet is guided with a predetermined jet cross section, while being directed tangentially with respect to the edge face, such that the etchant jet impinges only on the edge face and only with a part of the jet cross section.

2. The method of claim 1, wherein as the edge contour, an edge chamfer whose profile is macroscopically different to an original contour profile of the edge face existing before the etching, is etched by the etchant jet.

3. The method of claim 2, wherein the etched edge chamfer is a double-positive edge chamfer.

4. The method of claim 2, wherein the etched edge chamfer is an asymmetrical edge chamfer.

5. The method of claim 1, wherein the edge contour is etched in at least two different etching steps, and wherein at least one parameter from the group consisting of a diameter of the jet cross section, a volume flow rate of the etchant jet, and a rotational speed of the semiconductor body is varied between the etching steps.

6. The method of claim 5, wherein the edge face is at least partially smoothed in a first etching step.

7. The method of claim 5, wherein running traces of the chemical etchant and/or inhomogeneities on the edge face are eliminated in a last etching step.

8. The method of claim 1, wherein a maximum of the jet cross section is limited to a diameter of at most 50% of a spacing of the edges of the respective main faces delimiting the edge face.

9. The method of claim 1, wherein as the edge contour, at least a part of the edge face is only smoothed by the etchant jet, and wherein an original contour profile of the smoothed part of the edge face, existing before the etching, remains macroscopically unchanged.

10. The method of claim 1, wherein a rotation direction of the semiconductor body at an impingement point of the etchant jet on the edge face is substantially the same as a jet direction of the etchant jet.

11. The method of claim 1, wherein an additive is added to the chemical etchant to reduce a surface tension of the chemical etchant.

12. The method of claim 1, wherein the rotation axis is aligned vertically or horizontally in space.

13. The method of claim 1, wherein the etchant jet is vertically bound between a first plane that is coplanar with a first one of the at least two mutually spaced-apart main faces of the semiconductor body and a second plane that is coplanar with a second one of the at least two mutually spaced-apart main faces of the semiconductor body.

* * * * *